(12) United States Patent
Matsuura

(10) Patent No.: US 6,335,125 B2
(45) Date of Patent: *Jan. 1, 2002

(54) PHOTOMASK AND METHOD OF MANUFACTURING SAME

(75) Inventor: Seiji Matsuura, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,576

(22) Filed: Mar. 19, 1999

(30) Foreign Application Priority Data

Apr. 2, 1998 (JP) .......................... 10-089884

(51) Int. Cl.$^7$ ................................ G03F 9/00
(52) U.S. Cl. .................................... 430/5
(58) Field of Search .............. 430/5, 30, 321

(56) References Cited

U.S. PATENT DOCUMENTS 5,397,663 A * 3/1995 Uesawa et al. ................. 430/5
5,563,009 A * 10/1996 Bae .............................. 430/5
5,786,113 A * 7/1998 Hashimoto et al. ............ 430/5

FOREIGN PATENT DOCUMENTS

| JP | 4-342255 | 11/1992 |
| JP | 8-54727 | 2/1996 |
| JP | 9-73166 | 3/1997 |
| JP | 9-146256 | 6/1997 |
| JP | 9-288346 | 11/1997 |

* cited by examiner

Primary Examiner—Mark F. Huff
Assistant Examiner—Saleha R. Mohamedulla
(74) Attorney, Agent, or Firm—Young & Thompson

(57) ABSTRACT

A photomask has an isolated residual pattern formed on it, and a translucent film formed on both sides of this isolated residual pattern, with a space pattern part therebetween, the width of the translucent film being approximately equal to the line width of the isolated residual pattern.

5 Claims, 2 Drawing Sheets

PHOTOMASK AND METHOD OF MANUFACTURING SAME

BACKGROUND OF THE INVENTION

1. Field of the Invention

The present invention relates to a photomask and to a method of manufacturing a photomask, and more particularly to a photomask with reduced variation in light intensity caused by defocusing, enabling the achievement of a highly accurate micropattern, and a method of manufacturing such a photomask.

2. Description of the Related Art

Photomasks in the past were, for example, as shown in FIGS. 3 (a) and (b).

FIG. 3 (a) shows the first example of a prior art photomask, for the case of using an isolated residual pattern 11 in combination with positive photoresist, this photoresist being used to obtain a prescribed pattern. FIG. 3 (b) shows the case in which auxiliary patterns 12 are provided on both sides of the isolated residual pattern 11, separated therefrom by a prescribed spacing.

FIG. 3 (c) is a graph presenting a plot of the variation in light intensity on the photoresist for the case of using the isolated residual pattern 11, obtained with a defocusing step of 0.2 µm, the dotted lines indicating the case of forming a pattern of 0.2 µm width onto the resist, this showing how, with defocusing, there is a great change in the light intensity in the region in which the pattern is formed, so that defocusing results in the pattern becoming narrow.

In the case of using the isolated residual pattern shown in FIG. 3 (a), therefore, it is possible to obtain a depth of focus of only approximately 0.7 µm, and even in the case of FIG. 3 (b), in which the method used is that of providing auxiliary patterns, it is only possible to obtain a depth of focus of 1.0 µm.

In the case of FIG. 3 (b), to prevent resolution of the auxiliary pattern 12, it is necessary to make the width w of the auxiliary pattern 12 small and, for this reason, there is the problem of difficulty in fabricating the mask.

Known photomask is such as described, for example, in Japanese Unexamined Patent Publication (KOKAI) No.8-54727, but this photomask does not solve the above-described problem.

Accordingly, it is an object of the present invention to improve on the above-noted drawback of the prior art, and in particular to provide a photomask that reduces the variation in light intensity caused by defocusing, and enables the achievement of a highly accurate micropattern, and a method of manufacturing this photomask.

SUMMARY OF THE INVENTION

In order to achieve the above-noted object, the present invention adopts the following basic technical constitution.

Specifically, in the first aspect of a photomask according to the present invention, a translucent film is disposed on both sides of the isolated residual pattern, with a space pattern therebetween.

In a second aspect of the present invention, the width of the space pattern is approximately equal to the line width of the above-noted isolated residual pattern.

In the third aspect of the present invention, the transmissivity of the translucent film is in the range from 10% to 60%.

In the fourth aspect of the present invention, the translucent film does not invert the phase.

In the fifth aspect of the present invention, the width of the translucent film is at least the width of the isolated residual pattern.

In the first aspect of a method of manufacturing a photomask according to the present invention, an isolated residual pattern is formed onto the photomask, and a non-phase-inverting translucent film is placed on both sides of this isolated residual film, with a space pattern therebetween having a width that is approximately the same width as the isolated residual pattern, thereby reducing the variation in light intensity caused by defocusing.

In the second aspect of the above-noted method of manufacturing a photomask according to the present invention, the transmissivity of the translucent film is in the range from 10% to 60%.

A photomask according to the present invention has an isolated residual pattern formed onto a photomask, and has a translucent film formed on both sides of this isolated residual pattern, with a space pattern therebetween that has a width that is approximately equal to that of the isolated residual pattern. By adopting this configuration, even in the case of defocusing, the pattern that is formed onto the resist does not become narrower.

Furthermore, because a difficult-to-fabricate auxiliary pattern is not used, manufacturing is facilitated.

DESCRIPTION OF THE PREFERRED EMBODIMENTS

Preferred embodiments of the present invention are described in detail below, with reference being made to the relevant accompanying drawings.

Figure 1:
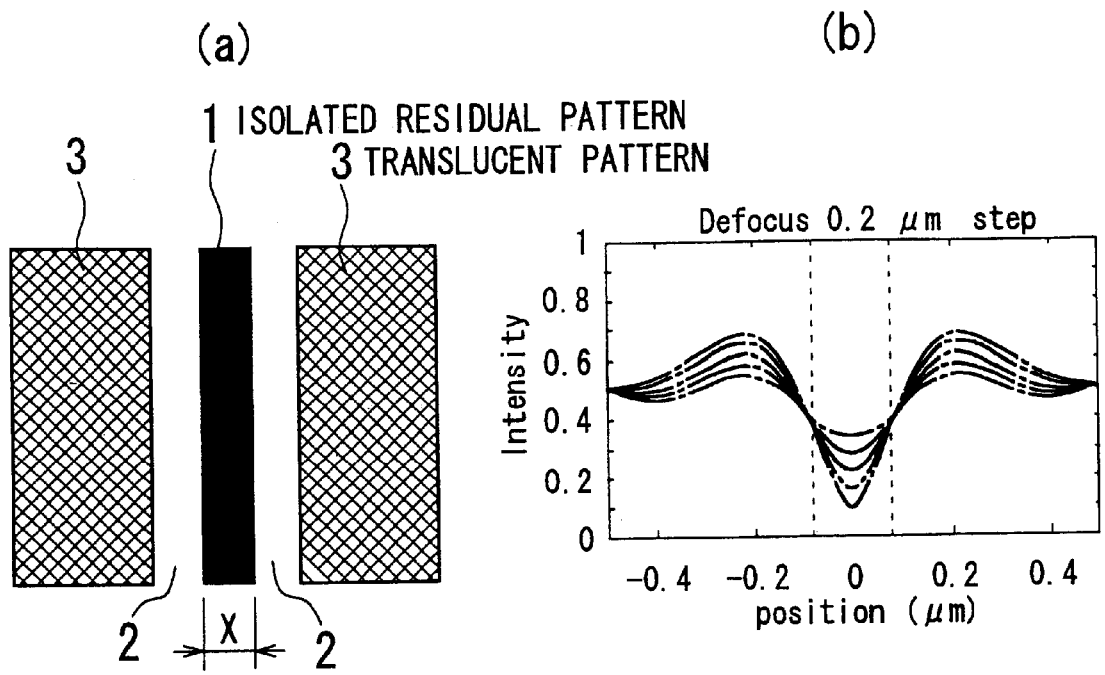
FIG. 1 is a drawing that shows a photomask according to the present invention, (a) being a plan view of the pattern, and (b) being a graph that shows a plot of the light intensity in the case of defocusing.

FIG. 1 is a drawing that shows a photomask according to the present invention, this drawing showing a photomask in which on both sides of an isolated residual pattern 1 are formed translucent films 3, with space pattern parts 2 having a width that is approximately the same as the line width X of the isolated residual pattern 1 therebetween.

In the above-noted case, it is desirable that the translucent films 3 have a transmissivity in the range from 10% to 60%, and that the translucent films 3 be such that they do not cause phase inversion.

Results of light intensity simulation indicate that at a transmissivity greater than 60% the pattern is not resolved, and that at a transmissivity of less than 10% the effect of the present invention is not obtained.

Using a KrF excimer laser stepper, having an annular illumination with a numerical aperture (NA) of 0.6 and coherency σ of 0.75, if the above-noted mask is used and the line width of the space pattern 2 is set to 0.20 µm and the transmissivity of the translucent film 3 is set to 50%, the depth of focus of a 0.20 µm-wide isolated residual pattern 1 was improved to approximately 1.0 µm.

FIG. 1 (b) is a graph that shows a plot of the variation in light intensity on the photoresist, using the above-noted photomask with a defocusing step of 0.2 µm.

In FIG. 1 (*b*), it is seen that with defocusing there is a great change in the light intensity in a region that is surrounded by the dotted line. However, in the case of the present invention, the degree of variation in light intensity in this region surrounded by the dotted lines is small, indicating an improvement in the depth of focus by a reduction in the influence of defocusing.

Figure 2:
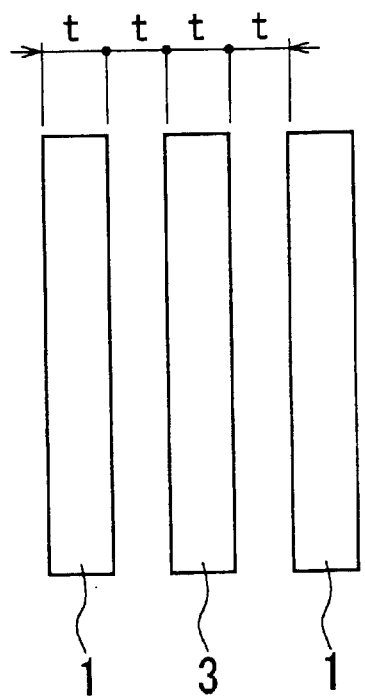
FIG. 2 is a drawing that shows another embodiment of the present invention.
Figure 3:
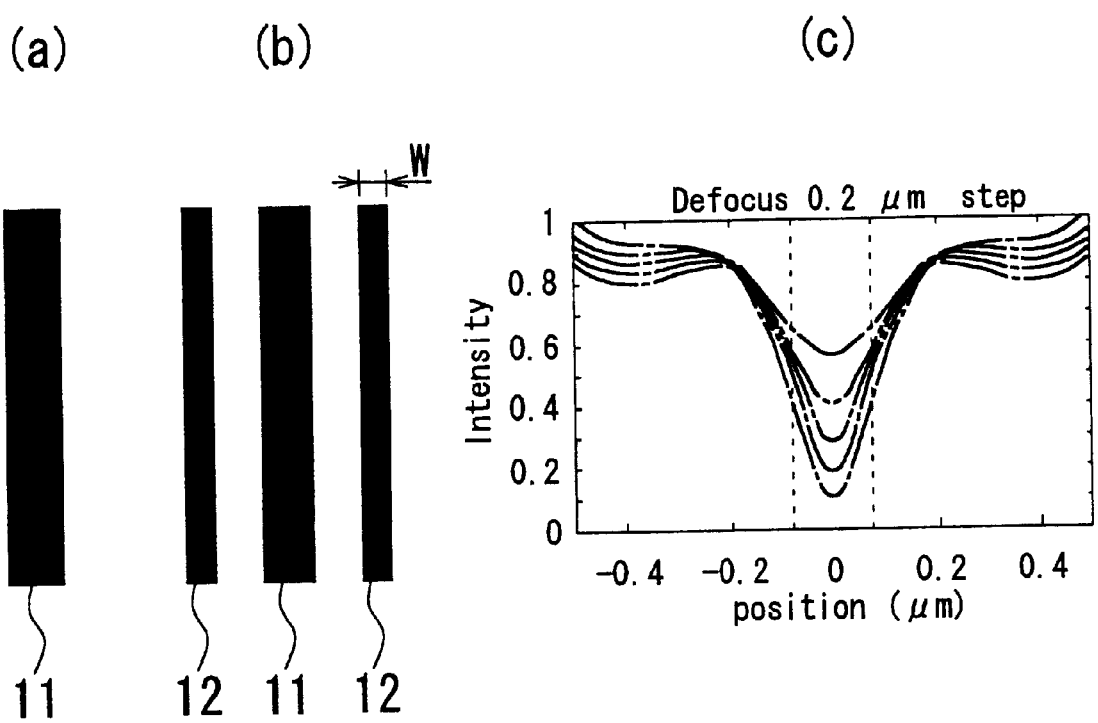
FIG. 3 is a drawing that illustrates the prior art.

With respect to an isolated residual pattern 1 having a width of t such as shown in FIG. 2, the present invention achieves its object if the width of the translucent film 3 is greater than t.

In addition to the isolated residual pattern of FIG. 1, the present invention can be applied in the same manner to a line & space pattern having a line-to-space ratio of 1:3 or greater, and to a sparse dot (island) pattern.

By virtue of the technical constitution described above, a photomask and fabrication method therefor according to the present invention prevent a narrowing of the pattern formed on photoresist and improve the depth of focus, even in the case of defocusing.

Furthermore, because the present invention does not make use of a difficult-to-fabricate auxiliary pattern, it facilitates manufacturing.

What is claimed is:

1. A photomask, comprising:

an isolated residual pattern that is a stripe-shaped region with a length in a first direction and a width in a second direction perpendicular to the first direction; and plural stripe-shaped translucent films, each with a length in the first direction and a width in the second direction, one of said plural translucent films being on each side of said isolated residual pattern, each of said plural translucent films having a width that is greater than the width of the stripe-shaped region, said isolated residual pattern and each adjacent one of said plural translucent films being spaced apart by a distance in the second direction equal to the width of the stripe-shaped region.

2. The photomask of claim 1, wherein a transmissivity of said plural translucent films is in the range of 10% to 60%.

3. The photomask of claim 1, wherein said plural translucent films are non-phase-inverting films.

4. A method of manufacturing a photomask, the steps comprising:

forming an isolated residual pattern that is a stripe-shaped region with a length in a first direction and a width in a second direction perpendicular to the first direction;

placing a non-phase-inverting translucent film on each side of the isolated residual pattern, each of the non-phase-inverting translucent films having a length in the first direction and a width in the second direction that is greater than the width of the stripe-shaped region; and separating the isolated residual pattern from each of the non-phase-inverting translucent films by a distance in the second direction equal to the width of the stripe-shaped region.

5. The method of claim 4, wherein each of the translucent films has a transmissivity in the range 10% to 60%.

* * * * *